United States Patent
Guo et al.

(10) Patent No.: US 8,278,548 B2
(45) Date of Patent: Oct. 2, 2012

(54) ACRYLIC FILM AND ACRYLIC BACKSHEET PREPARED THEREFROM

(75) Inventors: Hailan Guo, Warrington, PA (US);
Matthieu Olivier Sonnati, Nice (FR);
Robert Lee Post, Ivyland, PA (US);
David Elmer Vietti, Cary, IL (US)

(73) Assignee: Rohm and Haas Company, Philadelphia, PA (US)

( * ) Notice: Subject to any disclaimer, the term of this patent is extended or adjusted under 35 U.S.C. 154(b) by 385 days.

(21) Appl. No.: 12/655,164

(22) Filed: Dec. 23, 2009

(65) Prior Publication Data

US 2010/0175737 A1    Jul. 15, 2010

Related U.S. Application Data

(60) Provisional application No. 61/204,694, filed on Jan. 9, 2009.

(51) Int. Cl.
*H01L 31/042* (2006.01)
*H01L 31/18* (2006.01)
(52) U.S. Cl. ........................................ 136/251; 136/259
(58) Field of Classification Search ............... 428/411.1; 136/251, 259; 524/800, 847, 925
See application file for complete search history.

(56) References Cited

U.S. PATENT DOCUMENTS

| | | | |
|---|---|---|---|
| 3,562,235 A | | 2/1971 | Ryan |
| 3,812,205 A | * | 5/1974 | Dunkelberger ............ 525/261 |
| 4,141,935 A | | 2/1979 | Dunkelberger |
| 5,741,370 A | | 4/1998 | Hanoka |
| 6,320,116 B1 | | 11/2001 | Hanoka |
| 2007/0154704 A1 | | 7/2007 | Debergalis et al. |
| 2007/0166469 A1 | | 7/2007 | Snow et al. |
| 2008/0096143 A1 | | 4/2008 | Quintens |
| 2008/0154004 A1 | | 6/2008 | Uschold et al. |
| 2008/0156367 A1 | | 7/2008 | Uschold et al. |
| 2008/0251181 A1 | | 10/2008 | Quintens et al. |
| 2008/0254396 A1 | | 10/2008 | Quintens |
| 2008/0254397 A1 | | 10/2008 | Quintens et al. |
| 2008/0264484 A1 | | 10/2008 | Temchenko et al. |

FOREIGN PATENT DOCUMENTS

| | | |
|---|---|---|
| JP | 2008-306947 | 11/1996 |
| JP | 2004-247390 | 9/2004 |
| JP | 2007-007885 | 1/2007 |
| JP | 2007-320039 A | 12/2007 |
| JP | 2007-329939 | 12/2007 |
| WO | WO 2007/079246 | 7/2007 |

* cited by examiner

*Primary Examiner* — Mark Kopec
(74) *Attorney, Agent, or Firm* — Stephen T. Falk

(57) ABSTRACT

An acrylic film including from 70% to 99%, by weight based on the weight of the film, of a certain multi-stage acrylic polymer and from 1% to 20%, by weight based on the weight of the film, pigment is provided. Also provided is a method for forming the acrylic film, a backsheet for a photovoltaic array that includes the acrylic film and a polyester layer, and a method for forming the backsheet.

3 Claims, No Drawings

ACRYLIC FILM AND ACRYLIC BACKSHEET PREPARED THEREFROM

This invention claims priority to U.S. Provisional Application No. 61/204,694 filed Jan. 9, 2009.

This invention relates to an acrylic film. More particularly this invention relates to an acrylic film including from 70% to 99%, by weight based on the weight of the film, multi-stage acrylic polymer including from 10% to 75% by weight, based on the weight of the multi-stage polymer, first polymer including, as copolymerized units, from 0% to 20% by weight, based on the weight of the first polymer, C1-C6 alkyl methacrylate, the methacrylate having a homopolymer glass transition temperature ("Tg") of from 60° C. to 120° C. and from 80% to 100% by weight, based on the weight of the first polymer, C1-C12 alkyl acrylate, the acrylate having a homopolymer Tg of lower than 10° C.; and from 25% to 90% by weight, based on the weight of the multi-stage polymer, second polymer formed in the presence of the first polymer including, as copolymerized units, from 50% to 100% by weight, based on the weight of the second polymer, C1-C6 alkyl methacrylate, the methacrylate having a homopolymer glass transition temperature ("Tg") of from 60° C. to 120° C.; from 0% to 20% by weight, based on the weight of the second polymer, C1-C12 alkyl acrylate, the acrylate having a homopolymer Tg of lower than 10° C., and from 0% to 30% by weight, based on the weight of the second polymer, of a monomer having a homopolymer Tg of higher than 120° C.; and from 1% to 20%, by weight based on the weight of the film, pigment. The invention also relates to a method for forming the acrylic film, a backsheet for a photovoltaic array that includes the acrylic film and a polyester layer, and a method for forming the backsheet.

U.S. Patent Application Publication No. 2008/0264484 discloses a protective backing sheet for photovoltaic modules including a layer including crosslinkable amorphous fluoropolymers. There has been a need for a backsheet for photovoltaic arrays that includes a layer including alternative polymeric compositions, particularly materials fully functional in the application that provide a lower cost basis and facile processing. The acrylic film of the present invention is capable of facile formation and exhibits desirable solar reflectance and low shrinkage and may be used as a component to be formed into a useful backsheet for a photovoltaic array In a first aspect of the present invention, there is provided an acrylic film comprising from 70% to 99%, by weight based on the weight of said film, multi-stage acrylic polymer comprising from 10% to 75% by weight, based on the weight of said multi-stage polymer, first polymer comprising, as copolymerized units, from 0% to 20% by weight, based on the weight of said first polymer, C1-C6 alkyl methacrylate, said methacrylate having a homopolymer glass transition temperature ("Tg") of from 60° C. to 120° C. and from 80% to 100% by weight, based on the weight of said first polymer, C1-C12 alkyl acrylate, said acrylate having a homopolymer Tg of lower than 10° C.; and from 25% to 90% by weight, based on the weight of said multi-stage polymer, second polymer formed in the presence of said first polymer comprising, as copolymerized units, from 50% to 100% by weight, based on the weight of said second polymer, C1-C6 alkyl methacrylate, said methacrylate having a homopolymer glass transition temperature ("Tg") of from 60° C. to 120° C.; from 0% to 20% by weight, based on the weight of said second polymer, C1-C12 alkyl acrylate, said acrylate having a homopolymer Tg of lower than 10° C., and from 0% to 30% by weight, based on the weight of said second polymer, of a polymer having a homopolymer Tg of higher than 120° C.; and from 1% to 20%, by weight based on the weight of said film, pigment.

In a second aspect of the present invention there is provided a method for forming an acrylic film comprising: forming a composition comprising: from 70% to 99%, by weight based on the weight of said film, multi-stage acrylic polymer comprising forming from 10% to 75% by weight, based on the weight of said multi-stage polymer, first polymer comprising, as copolymerized units, from 0% to 20% by weight, based on the weight of said first polymer, C1-C6 alkyl methacrylate, said methacrylate having a homopolymer glass transition temperature ("Tg") of from 60° C. to 120° C. and from 80% to 100% by weight, based on the weight of said first polymer, C1-C12 alkyl acrylate, said acrylate having a homopolymer Tg of lower than 10° C.; forming, in the presence of said first polymer, from 25% to 90% by weight, based on the weight of said multi-stage polymer, second polymer comprising, as copolymerized units, from 50% to 100% by weight, based on the weight of said second polymer, C1-C6 alkyl methacrylate, said methacrylate having a homopolymer glass transition temperature ("Tg") of from 60° C. to 120° C.; from 0% to 20% by weight, based on the weight of said second polymer, C1-C12 alkyl acrylate, said acrylate having a homopolymer Tg of lower than 10° C., and from 0% to 30% by weight, based on the weight of said second polymer, of a polymer having a homopolymer Tg of higher than 120° C.; and from 1% to 20%, by weight based on the weight of said film, pigment; and forming said acrylic film from said composition by calendering or cast film formation.

In a third aspect of the present invention there is provided a photovoltaic array backsheet comprising: a film comprising: a multi-stage acrylic polymer comprising from 10% to 75% by weight, based on the weight of said multi-stage polymer, first polymer comprising, as copolymerized units, from 0% to 20% by weight, based on the weight of said first polymer, C1-C6 alkyl methacrylate, said methacrylate having a homopolymer glass transition temperature ("Tg") of from 60° C. to 120° C. and from 80% to 100% by weight, based on the weight of said first polymer, C1-C12 alkyl acrylate, said acrylate having a homopolymer Tg of lower than 10° C.; and from 25% to 90% by weight, based on the weight of said multi-stage polymer, second polymer formed in the presence of said first polymer comprising, as copolymerized units, from 50% to 100% by weight, based on the weight of said second polymer, C1-C6 alkyl methacrylate, said methacrylate having a homopolymer glass transition temperature ("Tg") of from 60° C. to 120° C.; from 0% to 20% by weight, based on the weight of said second polymer, C1-C12 alkyl acrylate, said acrylate having a homopolymer Tg of lower than 10° C., and from 0% to 30% by weight, based on the weight of said second polymer, of a polymer having a homopolymer Tg of higher than 120° C.; and from 1% to 20%, by weight based on the weight of said film, pigment; and, affixed thereto, a polyester layer.

In a fourth aspect of the present invention there is provided a method for forming a photovoltaic array backsheet comprising: forming an acrylic film composition comprising: a multi-stage acrylic polymer comprising from 10% to 75% by weight, based on the weight of said multi-stage polymer, first polymer comprising, as copolymerized units, from 0% to 20% by weight, based on the weight of said first polymer, C1-C6 alkyl methacrylate, said methacrylate having a homopolymer glass transition temperature ("Tg") of from 60° C. to 120° C. and from 80% to 100% by weight, based on the weight of said first polymer, C1-C12 alkyl acrylate, said acrylate having a homopolymer Tg of lower than 10° C.; and from 25% to 90% by weight, based on the weight of said multi-stage polymer, second polymer formed in the presence of said first polymer comprising, as copolymerized units, from 50% to 100% by weight, based on the weight of said second polymer, C1-C6 alkyl methacrylate, said methacrylate having a homopolymer glass transition temperature ("Tg") of from 60° C. to 120° C.; from 0% to 20% by weight, based on the weight of said second polymer, C1-C12 alkyl acrylate, said acrylate having a homopolymer Tg of lower than 10° C., and from 0% to 30% by weight, based on the weight of said second polymer, of a polymer having a homopolymer Tg of higher than 120° C.; and from 1% to 20%, by weight based on the weight of said film, pigment; forming an acrylic film from said composition by calendering or cast film formation; and affixing thereto, a polyester layer.

The present invention relates to an acrylic film including from 70% to 99%, preferably from 85% to 95%, by weight based on the weight of the film, of a multi-stage acrylic polymer. By "acrylic polymer" herein is meant a polymer including at least 70%, by weight based on the polymer weight, as copolymerized units, of monomers selected from the acids, esters, amides, and nitriles of acrylic or methacrylic acid. By "multi-stage acrylic polymer" herein is meant a polymer prepared by emulsion polymerization in which two or more different compositions are polymerized sequentially.

The multi-stage acrylic polymer of this invention includes from 10% to 75%, preferably from 15% to 40%, by weight, based on the weight of the multi-stage polymer, first polymer including, as copolymerized units, from 0% to 20%, preferably from 0% to 10% by weight, based on the weight of the first polymer, C1-C6 alkyl methacrylate, the methacrylate having a homopolymer glass transition temperature ("Tg") of from 60° C. to 120° C. and from 80% to 100%, preferably from 90% to 100%, by weight, based on the weight of the first polymer, C1-C12 alkyl acrylate, the acrylate having a homopolymer Tg of lower than 10° C.; and from 25% to 90%, preferably from 60% to 85%, by weight, based on the weight of the multi-stage polymer, second polymer formed in the presence of the first polymer including, as copolymerized units, from 50% to 100%, preferably from 60% to 80%, by weight, based on the weight of the second polymer, C1-C6 alkyl methacrylate, the methacrylate having a homopolymer glass transition temperature ("Tg") of from 60° C. to 120° C.; from 0% to 20%, preferably from 2% to 10%, by weight, based on the weight of the second polymer, C1-C12 alkyl acrylate, the acrylate having a homopolymer Tg of lower than 10° C., and from 0% to 30%, preferably from 3% to 25%, by weight, based on the weight of the second polymer, of a monomer having a homopolymer Tg of higher than 120° C.

In certain embodiments the multistage acrylic polymer may include four stages. Typical four-stage polymers include (1) from 10% to 35%, preferably from 15% to 30%, by weight, based on the weight of the multi-stage polymer, stage 1 polymer including, as copolymerized units, from 0% to 20%, preferably from 0% to 10% by weight, based on the weight of the first polymer, C1-C6 alkyl methacrylate, the methacrylate having a homopolymer glass transition temperature ("Tg") of from 60° C. to 120° C. and from 80% to 100%, preferably from 90% to 100%, by weight, based on the weight of the first polymer, C1-C12 alkyl acrylate, the acrylate having a homopolymer Tg of lower than 10° C.; (2) from 10% to 35%, preferably from 15% to 30% by weight, based on the weight of the multi-stage polymer, stage 2 polymer formed in the presence of the stage 1 polymer including, as copolymerized units, from 50% to 90%, preferably from 50% to 70%, by weight, based on the weight of the stage 2 polymer, C1-C6 alkyl methacrylate, the methacrylate having a homopolymer glass transition temperature ("Tg") of from 60° C. to 120° C., and from 0% to 50%, preferably from 30% to 50%, by weight, based on the weight of the stage 2 polymer, C1-C12 alkyl acrylate, the acrylate having a homopolymer Tg of lower than 10° C.; (3) from 10% to 35%, preferably from 15% to 30% by weight, based on the weight of the multi-stage polymer, stage 3 polymer formed in the presence of the stage 2 polymer including, as copolymerized units, from 50% to 100%, preferably from 60% to 80%, by weight, based on the weight of the stage 3 polymer, C1-C6 alkyl methacrylate, the methacrylate having a homopolymer glass transition temperature ("Tg") of from 60° C. to 120° C.; from 0% to 20%, preferably from 2% to 10%, by weight, based on the weight of the stage 3 polymer, C1-C12 alkyl acrylate, the acrylate having a homopolymer Tg of lower than 10° C.; and from 0% to 30%, preferably from 3% to 25%, by weight, based on the weight of the second polymer, of a monomer having a homopolymer Tg of higher than 120° C.; and (4) from 10% to 35%, preferably from 15% to 30% by weight, based on the weight of the multi-stage polymer, stage 4 polymer formed in the presence of the stage 3 polymer including, as copolymerized units, from 50% to 100%, preferably from 60% to 80%, by weight, based on the weight of the stage 4 polymer, C1-C6 alkyl methacrylate, the methacrylate having a homopolymer glass transition temperature ("Tg") of from 60° C. to 120° C.; from 0% to 20%, preferably from 2% to 10%, by weight, based on the weight of the stage 4 polymer, C1-C12 alkyl acrylate, the acrylate having a homopolymer Tg of lower than 10° C.; and from 0% to 30%, preferably from 3% to 25%, by weight, based on the weight of the second polymer, of a monomer having a homopolymer Tg of higher than 120° C.

Acrylic monomers include monomeric acrylic or methacrylic esters. Suitable acrylate monomers include methyl acrylate, ethyl acrylate, n-butyl acrylate, lauryl acrylate, 2-ethylhexyl acrylate, cyclohexyl acrylate, iso-octyl acrylate, octadecyl acrylate, nonyl acrylate, decyl acrylate, isobornyl acrylate, dodecyl acrylate, phenyl acrylate, and benzyl acrylate. Suitable methacrylate monomers include methyl methacrylate, ethyl methacrylate, n-butyl methacrylate, lauryl methacrylate, 2-ethylhexyl methacrylate, cyclohexyl methacrylate, iso-octyl methacrylate, octadecyl methacrylate, nonyl methacrylate, decyl methacrylate, isobornyl methacrylate, and dodecyl methacrylate. Other useful monomers include styrene, α-methylstyrene and vinyltoluene; acrylonitrile and methacrylonitrile; vinyl esters such as vinyl acetate; and acid anhydrides such as maleic anhydride.

In certain embodiments any stage, independently, includes from 0% to 10%, preferably from 0% to 5%, more preferably from 0% to 2%, based on the weight of the stage polymer, of a copolymerized multi-ethylenically unsaturated monomer. In certain embodiments all stages other than the last stage polymer, include from 0.1% to 5%, more preferably from 0.1% to 2% of a copolymerized multi-ethylenically unsaturated monomer. In certain embodiments the last stage polymer, independently, is free from copolymerized multi-ethylenically unsaturated monomer. Multi-ethylenically unsaturated monomers include, for example, allyl (meth)acrylate, diallyl phthalate, 1,4-butylene glycol di(meth)acrylate, 1,3-butanediol dimethacrylate, triallyl cyanurate, 1,2-ethylene glycol di(meth)acrylate, 1,6-hexanediol di(meth)acrylate, and divinyl benzene.

In certain embodiments any stage, independently, includes from 0% to 5%, preferably from 0% to 1%, of a copolymerized monoethylenically-unsaturated acid monomer, based on the weight of the first polymer. Acid monomers include carboxylic acid monomers such as, for example, acrylic acid, methacrylic acid, crotonic acid, itaconic acid, fumaric acid, maleic acid, monomethyl itaconate, monomethyl fumarate, monobutyl fumarate, and maleic anhydride; and sulfur- and phosphorous-containing acid monomers.

The glass transition temperature ("Tg") of homopolymers may be found, for example, in "Polymer Handbook", edited by J. Brandrup and E. H. Immergut, Interscience Publishers.

In the multi-stage emulsion polymerization process at least two stages different in composition are formed in sequential fashion. The polymerization techniques used to prepare such aqueous multi-stage emulsion-polymers are well known in the art such as, for example, as disclosed in U.S. Pat. Nos. 3,562,235; 4,141,935; 4,325,856; 4,654,397; and 4,814,373. Conventional surfactants may be used such as, for example, anionic and/or nonionic emulsifiers such as, for example, alkali metal or ammonium alkyl sulfates, alkyl sulfonic acids, fatty acids, and oxyethylated alkyl phenols. The amount of surfactant used is usually 0.1% to 6% by weight, based on the weight of total monomer. Either thermal or redox initiation processes may be used. Conventional free radical initiators may be used such as, for example, hydrogen peroxide, t-butyl hydroperoxide, t-amyl hydroperoxide, ammonium and/or alkali persulfates, typically at a level of 0.01% to 3.0% by weight, based on the weight of total monomer. Redox systems using the same initiators coupled with a suitable reductant such as, for example, sodium sulfoxylate formaldehyde, sodium hydrosulfite, isoascorbic acid, hydroxylamine sulfate and sodium bisulfite may be used at similar levels, optionally in combination with metal ions such as, for example iron and copper, optionally further including complexing agents for the metal. Chain transfer agents such as, for example, mercaptans at a level of from 0% to 5%, by weight based on the weight of the stage monomer weight, may be used to lower the molecular weight of one or more of the polymer stages. Preferred in the last stage is a level of chain transfer agent of from 0.1% to 2%, by weight based on the weight of the stage monomer weight. The monomer mixture for a stage may be added neat or as an emulsion in water. The monomer mixture for a stage may be added in a single addition or multiple additions or continuously over the reaction period allotted for that stage using a uniform or varying composition; preferred is the addition of the first and/or second polymer monomer emulsion as a single addition. Additional ingredients such as, for example, free radical initiators, oxidants, reducing agents, chain transfer agents, neutralizers, surfactants, and dispersants may be added prior to, during, or subsequent to any of the stages. Processes yielding polymodal particle size distributions such as those disclosed in U.S. Pat. Nos. 4,384,056 and 4,539,361, for example, may be employed.

A multi-stage emulsion polymerization process usually results in the formation of at least two mutually incompatible polymer compositions, thereby resulting in the formation of at least two phases. The mutual incompatibility of two polymer compositions and the resultant multiphase structure of the polymer particles may be determined in various ways known in the art. The use of scanning electron microscopy using staining techniques to emphasize the difference between the phases, for example, is such a technique.

The average particle diameter of the multi-stage acrylic polymer particles is typically from 30 nanometers to 500 nanometers.

The acrylic film of the present invention includes from 1% to 20%, preferably from 5% to 10%, by weight based on the weight of the film, pigment. "Pigment" herein includes solid particulate material capable of scattering at least some fraction of the sunlight spectrum when embedded in the multi-stage acrylic polymer described herein. Useful pigment particle sizes typically range from 100 nm to 50 micrometers; pigment diameters must not exceed the thickness of the acrylic film. Inorganic particles include: metal oxides such as zinc oxide, cerium oxide, tin oxide, antimony oxide, zirconium oxide, chromium oxide, iron oxide, magnesium oxide, lead oxide, aluminum oxide, silicon oxide, titanium dioxide; carbonates such as ground calcium carbonate, precipitated calcium carbonate and colloidal calcium carbonate; aluminum hydroxide, magnesium hydroxide, zeolite, silica, fumed silica, carbon black, graphite, zinc sulfide, lithopone, calcium carbonate, calcium sulfate, barium sulfate, mica, clay, calcined clay, nanoclay, feldspar, nepheline syenite, wollastonite, diatomaceous earth, alumina silicates, talc, sodium potassium aluminum silicate particles, glass beads, ceramic spherical particles; soda lime particles; hollow glass particles; ceramic hollow spheres, glass fiber, carbon fiber and metal fibers. Optional organic particles include colored pigments such as blue pigment, plastic pigments such as solid bead pigments and microsphere pigments containing voids or vesicles. Examples of solid bead pigments include polystyrene and polyvinyl chloride beads. Examples of microsphere pigments, which include polymer particles containing one or more voids include Ropaque™ opaque polymer. Other suitable pigments include, for example, acrylonitrile/vinyl chloride expanded particles; polyvinylidene chloride copolymer coated with $CaCO_3$ particles, and organic fibers such as polyamide fibers. The pigment is selected to provide backscattering properties in order to improve the photovoltaic array backsheet performance and, independently and optionally, to control the appearance (color) of the photoelectric array when the acrylic sheet is used in such a construction. Mixtures of pigments may be used.

Hollow glass microspheres at a level of from 0% to 20%, preferably from 5% to 10%, by weight based on the weight of the film, may be used in the acrylic film of the present invention. Diameters of such hollow glass microspheres is typically between 10 and 100 micrometers, or alternatively between 20 and 80 micrometers. Mixtures of microspheres may be used. Examples of suitable commercially available hollow glass microspheres include those available from Potters Industries under the designations SPHERICEL™ 110P8 or SPHERICEL™ 60P18.

Additives including, for example, lubricants, flame retardants, antistatic agents, anti fogging agents, antimicrobial agents, antioxidants (at a level of from 0% to 1.5%, preferably from 0.2% to 0.8%, by weight based on the weight of the film), UV absorbers/stabilizers (at a level of from 0% to 3%, preferably from 1% to 2%, by weight based on the weight of the film), and plasticizers (e.g. DEHP), may optionally be added to the acrylic film.

Lubricants useful in the present invention include, for example, pure hydrocarbon lubricants such as liquid paraffin, natural paraffin, microcrystalline wax, synthetic paraffin and low-molecular-weight polyethylene; halogenated hydrocarbon lubricants; fatty acid lubricants such as higher fatty acids and hydroxy-fatty acids; fatty acid amide lubricants such as fatty acid amides and bis(fatty acid amide)s; and ester lubricants such as lower alcohol esters of fatty acids, polyhydric alcohol esters of fatty acids (e.g., glycerides), polyglycol esters of fatty acids, and fatty alcohol esters of fatty acids (i.e., ester waxes). In addition, they also include metal soaps, fatty alcohols, polyhydric alcohols, polyglycols, polyglycerols, partial esters derived from fatty acids and polyhydric alcohols, and partial esters derived from fatty acids and polyglycols or polyglycerols. These lubricants may be used alone or in admixture of two or more. Lubricants are typically used for modifying rheology of melt polymer. Internal lubricants are well known for mainly decreasing the shear viscosity of melt polymer while external lubricants are well known for decreasing friction occurring between melt polymer and metal wall of processing equipment. Lubricants can be used for modifying the surface of finished plastic products. Lubricants may be present in the invention from 0% to 5%, alternatively from 1% to 2%, by weight based on the weight of the film. Mixtures of lubricants may be used.

Flame/fire retardants include chlorinated paraffin, aluminum hydroxide, antimony trioxide and halogen compounds. Examples of suitable fire retardants include those commercially available from Clariant Corporation (Charlotte, N.C.), including those designated EXOLIT™ IFR 23, EXOLIT™ AP 750, EXOLIT™ OP grade materials based on organophosphorous compounds, and EXOLIT™ RP grades of red phosphorus materials; non-halogenated fire retardants, such as FIREBRAKE™ ZB and BORGARD™ ZB, and FR 370 (tris(tribromoneopentyl)phosphate), available from Dead Sea Bromine Group, Beer Shiva, Israel. Examples of suitable fire retardants that also function as thermally conductive pigments include aluminum hydroxide and magnesium hydroxide. Mixtures of fire retardants may be used.

The acrylic film of the present invention is formed from a composition including the multi-stage polymer and the pigment as described hereinabove. Typically the choice of processing technique is important because of the value of high dimensional stability. High dimensional stability, in our case, means low shrinkage when the film is heated during post-processing operations.

Shrinkage is believed to be mainly related to molecular orientation induced by the melt processing. In certain processes, this molecular orientation is "frozen" by the quick cooling of the extruded film. In other words, shrinkage issues are related to the "cooling under stress" of the film during its processing. It is preferred to make our acrylic film either by calendering or cast film processes. The reason of this choice over the other film processing techniques available (such as blown film or flat die extrusion) is that calendering and cast film are known to provide film with the lowest molecular orientation. In addition calendering and cast film produce mono-oriented films (machine direction) while processes such as blown film provide bi-oriented films (both machine and transverse direction).

However, common calendering and cast film processes still provide films with shrinkage (≈10% after 30 min @150° C.) greater than low shrinkage defined by current EU and US standards (<1% after 30 min @150° C.).

It is further preferred either to slow down the cooling (such as, for example, by the use of heating rolls), or to decrease the stress (such as by the use of a low-speed take-off rate or drawdown ratio≈1, i.e., melt velocity=film velocity) or both simultaneously.

Residual stress can be relaxed by integrating an additional processing step called annealing (aka stress release, tempering, physical aging, heat treatment). Preferred is the use of an in-line annealing process after the acrylic film is formed. From a molecular standpoint, stress relaxation is believed to correspond to the relaxation of polymeric chains from a stretched and highly oriented conformation into a random coil conformation. This phenomenon appears naturally when unstressed polymers are heated above their glass transition temperature ($T_g$).

The annealing step can be produced by any continuous/online heating system. The heating systems can be based on any radiant, convective or conductive heating device able to provide a film surface temperature comprised between 40° C. and 230° C., preferably between 130° C. and 200° C.

Heating systems useful in the present invention include, for example, electric infra-red system, gas-fired infra-red system, ceramics heater, hot air blower, water/oil/electrical heated rolls, etc. These heating systems may be used alone or in combinations of two or more.

Examples of suitable commercially available, heating systems include those available from Blasdel Enterprises, Inca under the designations Ceramic Generators, Coil-O-Rod™ Generators, Ceramic Panel Heaters, Quartz Tubes, Series FS Heaters, V Series Heater, Gas Catalytic Heaters.

Laboratory experiments have been made on a two roll mill which is believed to simulate calendering. A two roll mill is basically made of two heating metal roll which rotate in opposite direction. The gap between the roll can be adjusted from 0.15 mm to 5.0 mm. Formulations containing polymer and additives, in pellet or powder form, are directly added to the rolls. After plasticating and mixing, molten material formed a homogenous film around the front roll. After a specific amount of time, film was removed from the front roll according to a "Take Off" method. We have shown that when we decrease the speed at which the operator "takes off" the film, the shrinkage is significantly reduced. On an industrial scale, this would translate to low output and/or low drawdown ratio. Preferred is pre-drying of the acrylic polymer and the pigment (such as, for example, titanium dioxide) before processing for minimizing shrinkage.

In one aspect of present invention there is provided a photovoltaic array backsheet including: an acrylic layer including: a multi-stage acrylic polymer including from 10% to 75% by weight, based on the weight of the multi-stage polymer, first polymer including, as copolymerized units, from 0% to 20% by weight, based on the weight of said first polymer, C1-C6 alkyl methacrylate, said methacrylate having a homopolymer glass transition temperature ("Tg") of from 60° C. to 120° C. and from 80% to 100% by weight, based on the weight of said first polymer, C1-C12 alkyl acrylate, said acrylate having a homopolymer Tg of lower than 10° C.; and from 25% to 90% by weight, based on the weight of the multi-stage polymer, second polymer formed in the presence of the first polymer including, as copolymerized units, from 50% to 100% by weight, based on the weight of the second polymer, C1-C6 alkyl methacrylate, the methacrylate having a homopolymer glass transition temperature ("Tg") of from 60° C. to 120° C.; from 0% to 20% by weight, based on the weight of said second polymer, C1-C12 alkyl acrylate, said acrylate having a homopolymer Tg of lower than 10° C., and from 0% to 30% by weight, based on the weight of the second polymer, of a polymer having a homopolymer Tg of higher than 120° C.; and from 1% to 20%, by weight based on the weight of the layer, pigment; and, affixed thereto, a polyester layer. The multistage acrylic polymer and pigment are as described hereinabove. The backsheet construction includes one or more polyester layers (as described in US Patent Application Publications Nos. 2007/0166469 and 2008/0264484 and Japan Patent Publication No. 2007-007885), optionally corona discharge-treated, affixed to one or more acrylic layers, optionally corona discharge-treated, typically by the use of an appropriate adhesive, with the structure typically being formed by a laminating technique employing at least one acrylic and at least one polyester films. The total acrylic layer(s) thickness is typically from 50 micrometers to 250 micrometers and the total polyester layer(s) thickness is typically from 25 micrometers to 250 micrometers.

EXPERIMENTAL METHODS

Processing Methods

The acrylic film compositions were prepared by blending all components in pellets or powder form in a mixer. Commercial Materials and Suppliers used in the Examples are shown below.

| Product Name | Description | Producer | Physical Form |
|---|---|---|---|
| TIONA ™ RCL-4 | White Pigment (TiO$_2$) | Millenium Inorganic Chemicals | Powder |
| SPHERICEL ™ 60P18 | Hollow Glass Microspheres | Potters Industries | Powder |
| PARALOID ™ K-130D | Acrylic Processing Aid | Rohm and Haas Company | Powder |
| IRGANOX ™ 245 | Antioxidant | Ciba | Powder |

Film Calendering

Films were made using a Collin two roll mill (W. H. Collin GmbH Maschienefabrik, Aichach, Germany). The temperature of the front roll was set at 185° C., while the temperature of the rear roll was set at 183° C. 110 g of the composition was directly poured on the closed heated rolls of the two roll mill. The total processing time for making each film was 300 s and was divided into two successive phases with the following parameters:

Phase 1
Phase time: 280 s
Gap between rolls: 0.25 mm
Front Roll Speed: 26 rpm
Friction: −23%
Phase 2
Phase time: 20 s
Gap between rolls: 0.15 mm
Front Roll Speed: 5 rpm
Friction: −23%

After processing, the sheet formed around the front roll was removed from the roll according to either the Common Take-Off Method or the Low Speed Take-off Method as described hereafter.

Common Take-Off Method

The Common Take-off Method includes the six following steps:
the operator stops the rotation of both roll while gap between rolls is still closed,
the operator cuts the film in front of him according to the transverse direction using a wood knife,
the operator take each ends of the lower half of the cut film with his hands,
a second operator restarts the rotation of both rolls (set with a speed of 5 rpm),
the operator takes off and stretches the film trying to keep the contact front between film and roll at an approximate angle comprises between 30° and 60° as described in U.S. Pat. No. 6,551,688,
once totally released, the operator places the film on a flat metallic surface and allows it to cool down without any stress.

Low Speed Take-Off Method

The Low Speed Take-off Method includes the seven following steps:
the operator opens the gap between the rolls,
the operator stops the rotation of the front roll when the rolling back (aka flux) is in front of him,
the operator cuts the film according to the transverse direction and above the rolling bank (aka flux) using a wood knife,
the operator take each ends of the rolling bank (aka flux) with his hands,
a second operator restarts the rotation of the front roll (set with a speed of 5 rpm),
the operator slowly takes off the film without stretching it and trying to keep the contact front between film and roll at an approximate angle comprises between 60° and 90° as described in U.S. Pat. No. 6,551,688,
once totally released, the operator places the film on a flat metallic surface and allows it to cool down without any stress.

Test Methods

In the test methods and examples below, the sample dimensions (typically the length) were measured to the accuracy of the measuring tool.

All parts, percentages, ratios, etc. in the examples and the specification are by weight unless indicated otherwise.

Heat Shrinkage Test

For each sample five specimens of 76.2 mm×76.2 mm were prepared. Initial thickness and lengths in both machine direction (MD) and transverse direction (TD) were precisely measured using an electronic caliper (Brown & Sharpe, Model Digit-CAL MM2000) having a precision of 0.01 mm. Each of the five specimens was placed together in a ventilated oven for 30 min at a set temperature of 150° C.

The Heat Shrinkage (S) is defined herein as the percentage of length change in one specific direction after 30 min in an oven at 150° C. and is calculated as follows:

$$S = \frac{L - L_0}{L_0} \times 100$$

Where:
$L_0$: initial length of specimen in one specific direction (mm)
L: length of specimen in one specific direction after 30 min in a ventilated oven at 150° C. (mm)
Results of the five replicates were averaged to provide the Heat Shrinkage.

Solar Reflectance Measurement

For each sample one specimen of approximately 76.2 mm×76.2 mm were prepared. Solar reflectance was determined according to the method described in ASTM Standard C1549-02 using a Solar Spectrum Reflectometer Model SSR-ER.

Average value of solar reflectance at four wavelengths in the solar spectrum (380 nm, 500 nm, 650 nm and 1220 nm) through air mass 0 was measured in three different spots of each specimen. Results of the three measures were averaged to provide the Solar Reflectance.

Film Property Tests:

IEC 61215: International Test Standard for Crystalline silicon terrestrial photovoltaic (PV) modules.
Thermal cycling test: temperature: −40° C.±2 C and 85° C.±2° C.
Damp-heat test: temperature: 85° C.±2° C., relative humidity: 85%±5%

Humidity-freeze test: temperature: −40° C.±2 C and 85° C.±2° C., relative humidity at 85° C.: 85%±5%

Formation of Acrylic Polymers and Powders

An acrylic emulsion copolymer (polymer A) made according to the teachings of example 1 of U.S. Pat. No. 4,141,935 was prepared, with altered stage 3 and stage 4 compositions, i.e., 25 (MMA/BA:93/7) and 25 (MMA/BA/n-DDM: 9.5/7/0.5). The emulsion was then spray dried using a laboratory spray dryer (NIRO Inc., Soeborg, Denmark) to produce polymer A powder.

An acrylic emulsion copolymer (polymer B) made according to the teachings of example 1 of U.S. Pat. No. 4,141,935 was prepared, with altered stage 3 and stage 4 compositions, i.e., 25 (MMA/EA/alpha-methylstyrene:71/4/25)//25(MMA/EA/alpha-methylstyrene/n-DDM:70.5/4/25/0.5). The emulsion was then spray dried using a lab spray dryer (NIRO Inc., Soeborg, Denmark) to produce polymer B powder.

Examples 1-4

Formation and Evaluation of Acrylic Films

The polymer A and B powders were then formulated with different levels of $TiO_2$ and then processed. Details of the compositions and take-off method used for each example are given in Table 2.1.

TABLE 2.1

Formation of acrylic films

| Ex. No. | Polymer A (wt. %) | Polymer B (wt. %) | Tiona RCL-4 (wt. %) | Take-Off Method |
|---|---|---|---|---|
| 1 | 99 | 0 | 1 | Low Speed |
| 2 | 95 | 0 | 5 | Low Speed |
| 3 | 93 | 0 | 7 | Low Speed |
| 4 | 0 | 93 | 7 | Low Speed |

After calendering, the resultant films were then tested for heat shrinkage. Details of the results are given in Table 2.2.

TABLE 2.2

Evaluation of acrylic films

| Example No. | Film thickness (mm) | Heat Shrinkage in MD (%) | Heat Shrinkage in TD (%) |
|---|---|---|---|
| 1 | 0.25 | 4.8 | 0.6 |
| 2 | 0.23 | 8.3 | 2.3 |
| 3 | 0.28 | 10.3 | 2.2 |
| 4 | 0.32 | 2.6 | 0.6 |

The acrylic films of Examples 3 and 4 were also placed in a humidity oven and tests required by IEC 61215 (International test standard for crystalline silicon terrestrial photovoltaic (PV) modules) under the conditions described above; the results are summarized in Table 2.3

TABLE 2.3

Evaluation of acrylic films

| Acrylic film | 3 | 4 |
|---|---|---|
| Damp-heat test (500 hrs) | deformed | No apparent change |
| Humidity-freeze (10°Cycles)/thermal cycling test (50°Cycles) | deformed | No apparent change |

Examples 5-8

Formation and Evaluation of Acrylic Films

The polymer A was formulated with Hollow Glass microspheres then processed. Details of the formulation and take-off method used for each example are given in Table 5.1

TABLE 5.1

Formation of acrylic films

| Ex. No. | Polymer Abis (wt. %) | Sphericell 60P18 (wt. %) | Take-Off Method |
|---|---|---|---|
| 5 | 100 | 0 | Common |
| 6 | 100 | 0 | Low Speed |
| 7 | 95 | 5 | Common |
| 8 | 95 | 5 | Low Speed |

After calendering, the resultant films were then tested for heat shrinkage. Details of the results are given in Table 5.2.

TABLE 5.2

Evaluation of acrylic films

| Ex. No. | Film thickness (mm) | Heat Shrinkage in MD (%) | Heat Shrinkage in TD (%) |
|---|---|---|---|
| 5 | 0.32 | 3.4 | 0.4 |
| 6 | 0.23 | 2.9 | 1.0 |
| 7 | 0.24 | 7.7 | 2.8 |
| 8 | 0.23 | 1.7 | 0.3 |

Examples 9-12 and Comparative Example A

Formation and Evaluation of Acrylic Films

The polymer A powder was formulated with different levels of $TiO_2$ then processed according to the methods previously described. Details of the formulation and take-off method used for each example are given in Table 9.1

TABLE 9.1

Formation of acrylic sheets

| Ex. No. | Polymer A (wt. %) | Tiona RCL-4 (wt. %) | Take-Off Method |
|---|---|---|---|
| Comp. A | 100 | 0 | Low Speed |
| 9 | 99 | 1 | Low Speed |
| 10 | 95 | 5 | Low Speed |

TABLE 9.1-continued

Formation of acrylic sheets

| Ex. No. | Polymer A (wt. %) | Tiona RCL-4 (wt. %) | Take-Off Method |
|---|---|---|---|
| 11 | 90 | 10 | Low Speed |
| 12 | 85 | 15 | Low Speed |

After calendering, the resultant films were then tested for Solar Reflectance according to the corresponding test methods previously described. Details of the results are given in Table 9.2.

TABLE 9.2

Evaluation of acrylic sheets for solar reflectance

| Ex. No. | Average Solar Reflectance (Air Mass 0) |
|---|---|
| Comp. A | 0.055 |
| 9 | 0.511 |
| 10 | 0.662 |
| 11 | 0.777 |
| 12 | 0.801 |

The acrylic films Examples 9-12 of the invention exhibit useful levels of solar reflectance for use in photovoltaic array backsheets while the Comp. A acrylic film does not.

Comparative Example B

Formation of Acrylic Film

An acrylic emulsion copolymer (polymer C) made according to the teachings of example 1 of U.S. Pat. No. 4,141,935 was prepared, with altered stage 3 and stage 4 compositions of 25 (MMA/EA:96/4)//25(MMA/EA/n-DDM: 95.5/4/0.5). The emulsion was then spray dried using a lab spray dryer (NIRO Inc., Soeborg, Denmark) to produce polymer C powder.

The powder of polymer C was then pelletized with a 30 mm twin screw extruder and 4 mm 3-strand die (Werner & Phleiderer, Ramsey, N.J.). The barrel temperature was set at 200° C., the feed rate was set at 20 lbs/hour, and screw speed was set at 150 rpm.

The pellets of polymer C were then processed using a blown film line with a 30 mm die (Dr. Collin GmbH, Ebersberg, Germany) to produce a mono-layer blownfilm.

After blown film extrusion, the resultant films were then tested for heat shrinkage according to the corresponding test methods previously described.

Details of the results are given in Table B.1.

TABLE B.1

Evaluation of acrylic film

| Ex. No. | Film thickness (mm) | Heat Shrinkage in MD (%) | Heat Shrinkage in TD (%) |
|---|---|---|---|
| Comp. B | 0.07 | 78.0 | 41.0 |

Formation of the acrylic film Comp. B by blown film extrusion provides unacceptable heat shrinkage results.

Examples 13-17

Formation and Testing of Acrylic Films

The polymer A powder was formulated with 4 wt % PARALOID™ K-130D and 0.5 wt % IRGANOX™ 245. The composition was then pelletized with a 30 mm twin screw extruder and 4 mm 3-strand die (Werner & Pfleiderer, Ramsey, N.J.). The composition was prepared without pigment but is believed to simulate processing of the acrylic film of the invention. The barrel temperature was set at 200° C., the feed rate was set at 50 lbs/hour, and screw speed was set at 210 rpm.

The pellets were then processed using a cast film line (Black Clawson, Fulton, N.Y.) with a 3.5 in single screw extruder (30:1 L/D) and a 60 in wide flat die to produce a mono-layer film. The extruder has six heating/cooling zones which were set respectively at 395 F/425 F/450 F/450 F/480 F/480 F. The temperature of the different feed pipe elements were set at 490 F. The die has five different heating zones through the transverse direction which were set respectively at 490 F/480 F/470 F/480 F/490 F. The chill roll temperature was set at 180 F.

Five films were extruded with different processing parameters. The "output" corresponds to the weight of film produced in kg per hour. Screw speed and line speed were adjusted to produce the desired output.

The "draw down ratio" (DDR) is defined as follows:

$$DDR = \frac{L_D}{L_F}$$

Where:

$L_D$: Gap at the lip of the die (mm), $L_F$: Final film thickness (mm).

The "annealing temperature" is defined as the film surface temperature after the film passed in front of an online radiant-heating system used for annealing the film before winding. If the value of the "annealing temperature" is NA (Not Applicable), it means that the online radiant-heating system was turned off.

The resulting films were then tested for heat shrinkage according to the test methods previously described, except for the test time which was 10 min instead of 30 min.

Details of the processing parameters and results are given in Table 13.1

TABLE 13.1

Formation and evaluation of acrylic films

| Ex. No. | Film thickness (mm) | Output (kg·h⁻¹) | Draw Down Ratio | Annealing Temp. (°C.) | Heat Shrinkage in MD (%) | Heat Shrinkage in TD (%) |
|---|---|---|---|---|---|---|
| 13 | 0.127 | 50.9 | 6.0 | NA | 53.6 | 3.1 |
| 14 | 0.127 | 22.3 | 6.0 | NA | 13.5 | 3.2 |
| 15 | 0.114 | 22.3 | 1.8 | NA | 8.7 | 3.5 |
| 16 | 0.114 | 10.5 | 1.8 | NA | 4.1 | 3.2 |
| 17 | 0.114 | 10.5 | 1.8 | 177 | 1.2 | 0.6 |

The low draw-down ratio (<2) of Examples 15-17 provide superior heat shrinkage results.

Examples 18-21
Formation and Testing of Photovoltaic Array Backsheets

Sheets (in which pigment is absent from the acrylic film but are believed to represent the process for forming backsheets of this invention) approximately 9"×12" were cut from polymer A film that was about 0.003 inches thick and from Polyester film (MYLAR™ A) that was 0.005 inches thick. The sheets of polyester were corona treated. Some samples of polymer A film were corona treated and some samples were tested without treatment. The Rohm and Haas adhesive, ADCOTE™ 76R36B-33, was combined with Coreactant 9L7 at the recommended ratio of 100/3.3 parts by weight. The adhesive was applied to the polyester film with a #6, wire wound rod and the solvent was evaporated by placing the coated sheet in an 80° C. oven for one minute. The coat weight was 1.5-1.7 pounds/ream. The polymer A film was laminated to the polyester on a flat bed laminator with a heated roll at the nip temperatures indicated in Table 18.1. The laminated sheets were kept at room temperature for at least 3 days before testing. One inch wide strips were cut from the sheets and T-peel tests were run at a speed of 10"/min. The results are summarized in the table

TABLE 18.1

Evaluation of backsheets

| Ex. No. | Corona Treated | Nip Temp. (° F.) | Average (1-5") peel strength | | Max peel strength | | Mode of Failure |
|---|---|---|---|---|---|---|---|
| | | | Average (grams/inch) | Std Dev. (grams/inch) | Average (grams/inch) | Std Dev. (grams/inch) | |
| 18 | Yes | 170 | 502.0 | 96.5 | 843 | 183.4 | Zippy |
| 19 | No | 170 | 562.4 | 52.7 | 1131 | 195.0 | Zippy |
| 20 | No | 189 | 630.5 | 50.6 | 1100 | 162 | Zippy |
| 21 | Yes | 196 | — | — | 1904 | 192 | Acrylic Breaks |

Example 22
Formation of Photovoltaic Array Backsheet

Sheets approximately 9"×12" are cut from an acrylic film including 8 wt. parts polymer A and 92 wt. parts TiO2 that is 0.003 inches thick and from a polyester film (MYLAR™ A) that is 0.005 inches thick. The sheets of acrylic and polyester are corona treated. Adhesive, ADCOTE™ 76R36B-33, is combined with Coreactant 9L7 at a ratio of 100/3.3 parts by weight. The adhesive is applied to the polyester film with a #6, wire wound rod and the solvent is evaporated by placing the coated sheet in an 80° C. oven for one minute. The coat weight is 1.5 pounds/ream. The polymer A film is laminated to the polyester film on a flat bed laminator with a heated nip roll at 175 F. to provide a photovoltaic array backsheet of the present invention.

What is claimed is:

1. A photovoltaic array backsheet comprising:
   an acrylic film comprising: a multi-stage acrylic polymer comprising
      from 10% to 75% by weight, based on the weight of said multi-stage polymer, first polymer comprising, as copolymerized units, from 0% to 20% by weight, based on the weight of said first polymer, C1-C6 alkyl methacrylate, said methacrylate having a homopolymer glass transition temperature ("Tg") of from 60° C. to 120° C. and from 80% to 100% by weight, based on the weight of said first polymer, C1-C12 alkyl acrylate, said acrylate having a homopolymer Tg of lower than 10° C.; and
      from 25% to 90% by weight, based on the weight of said multi-stage polymer, second polymer formed in the presence of said first polymer comprising, as copolymerized units, from 50% to 100% by weight, based on the weight of said second polymer, C1-C6 alkyl methacrylate, said methacrylate having a homopolymer glass transition temperature ("Tg") of from 60° C. to 120° C.; from 0% to 20% by weight, based on the weight of said second polymer, C1-C12 alkyl acrylate, said acrylate having a homopolymer Tg of lower than 10° C., and from 0% to 30% by weight, based on the weight of said second polymer, of a polymer having a homopolymer Tg of higher than 120° C.; and from 1% to 20%, by weight based on the weight of said film, pigment; and
   affixed thereto, a polyester layer.

2. A method for forming a photovoltaic array backsheet comprising:
   forming an acrylic film composition comprising:
      from 70% to 99%, by weight based on the weight of said film, multi-stage acrylic polymer comprising
         from 10% to 75% by weight, based on the weight of said multi-stage polymer, first polymer comprising, as copolymerized units, from 0% to 20% by weight, based on the weight of said first polymer, C1-C6 alkyl methacrylate, said methacrylate having a homopolymer glass transition temperature ("Tg") of from 60° C. to 120° C. and from 80% to 100% by weight, based on the weight of said first polymer, C1-C12 alkyl acrylate, said acrylate having a homopolymer Tg of lower than 10° C.; and
         from 25% to 90% by weight, based on the weight of said multi-stage polymer, second polymer formed in the presence of said first polymer comprising, as copolymerized units, from 50% to 100% by weight, based on the weight of said second polymer, C1-C6 alkyl methacrylate, said methacrylate having a homopolymer glass transition temperature ("Tg") of from 60° C. to 120° C.; from 0% to 20% by weight, based on the weight of said second polymer, C1-C12 alkyl acrylate, said acrylate having a homopolymer Tg of lower than 10° C., and from 0% to 30% by weight, based on the weight of said second polymer, of a polymer having a homopolymer Tg of higher than 120° C.; and from 1% to 20%, by weight based on the weight of said film, pigment;
   forming an acrylic film from said composition by calendering or cast film formation; and
   affixing thereto, a polyester layer.

3. The method according to claim 2 further comprising treating said formed acrylic film by an in-line annealing process prior to affixing thereto, a polyester layer.

* * * * *